United States Patent
Fitzpatrick et al.

(10) Patent No.: US 6,860,027 B2
(45) Date of Patent: Mar. 1, 2005

(54) WAFER ALIGNMENT DEVICE

(75) Inventors: John Joseph Fitzpatrick, Woburn Sands (GB); John Bysouth, Baldock (GB)

(73) Assignee: Wentworth Laboratories Limited, Sandy (GB)

( * ) Notice: Subject to any disclaimer, the term of this patent is extended or adjusted under 35 U.S.C. 154(b) by 0 days.

(21) Appl. No.: 10/151,735

(22) Filed: May 20, 2002

(65) Prior Publication Data

US 2002/0194745 A1 Dec. 26, 2002

(30) Foreign Application Priority Data

May 19, 2001 (GB) .............................................. 0112305

(51) Int. Cl.⁷ .............................................. G01D 21/00
(52) U.S. Cl. .............................. 33/645; 33/613; 33/832; 414/936; 414/757
(58) Field of Search .................. 33/645, 613, 832–833, 33/533; 414/417, 757, 935–938, 940–941

(56) References Cited

U.S. PATENT DOCUMENTS

| | | | | |
|---|---|---|---|---|
| 5,028,200 A | * | 7/1991 | Shimane ..................... | 414/757 |
| 5,588,789 A | * | 12/1996 | Muka et al. ................. | 414/935 |
| 6,077,026 A | * | 6/2000 | Shultz ......................... | 414/937 |
| 6,155,773 A | * | 12/2000 | Ebbing et al. ............ | 414/744.5 |
| 6,212,961 B1 | * | 4/2001 | Dvir ........................... | 73/865.8 |
| 6,250,870 B1 | * | 6/2001 | Anderson et al. ........... | 414/941 |
| 6,283,701 B1 | * | 9/2001 | Sundar et al. ............ | 414/744.5 |
| 6,298,280 B1 | * | 10/2001 | Bonora et al. .............. | 414/941 |
| 6,322,312 B1 | * | 11/2001 | Sundar ..................... | 414/744.5 |
| 6,404,483 B1 | * | 6/2002 | Segers et al. ................ | 430/312 |
| 6,409,453 B1 | * | 6/2002 | Brodine et al. ............. | 414/941 |
| 6,425,280 B1 | * | 7/2002 | Ames et al. ................... | 33/645 |
| 6,514,033 B2 | * | 2/2003 | Sundar ..................... | 414/744.5 |
| 6,554,560 B2 | * | 4/2003 | Sinha ......................... | 414/757 |
| 2001/0000721 A1 | * | 5/2001 | Buermann ............... | 414/744.4 |
| 2002/0051704 A1 | * | 5/2002 | Sundar et al. ............ | 414/744.5 |

* cited by examiner

Primary Examiner—Christopher W. Fulton
Assistant Examiner—Yaritza Guadalupe
(74) Attorney, Agent, or Firm—Heslin Rothenberg Farley & Mesiti P.C.

(57) ABSTRACT

The device (1) picks up and aligns a sawframe (30) for handling and aligning silicon wafers (31). The device (1) includes at least one resiliently moveable locating arm (11) which is adapted to engage co-operably with a notch (35, 36) on the periphery of the sawframe (30) when the device (1) is moved into contact therewith. The sawframe (30) is thus urged into alignment with the device (1), and may be held in position relative to the device (1).

12 Claims, 4 Drawing Sheets

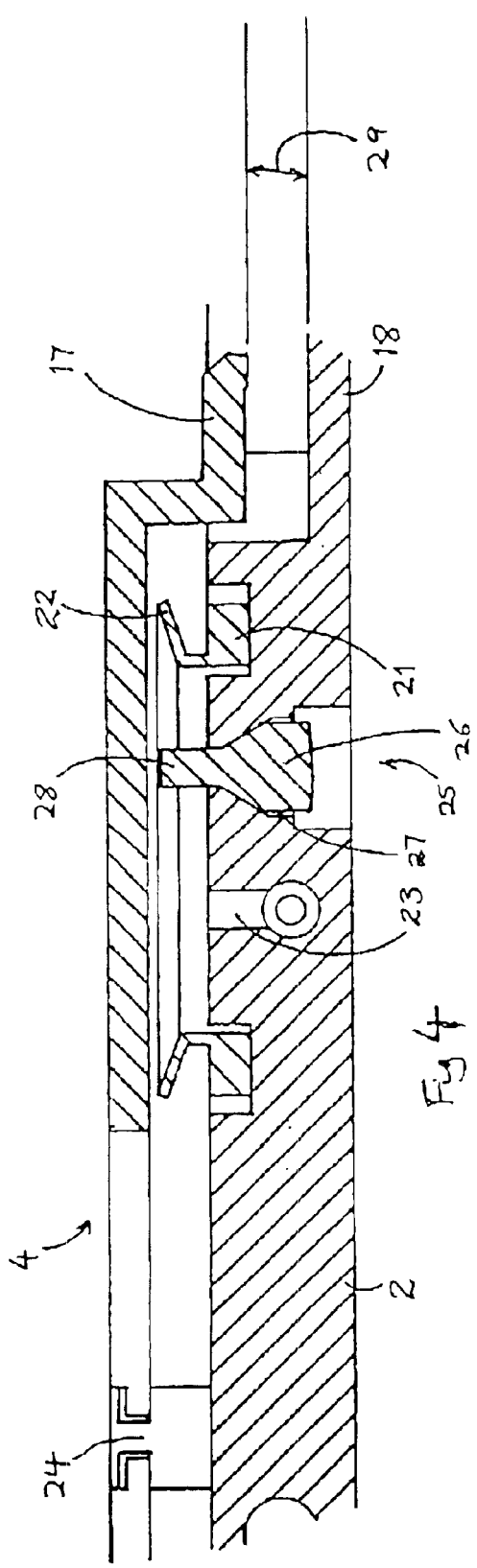
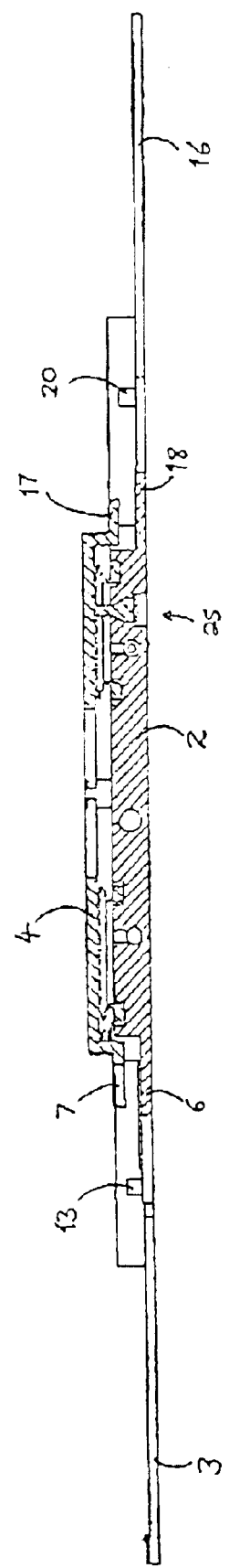

WAFER ALIGNMENT DEVICE

FIELD OF THE INVENTION

The present invention relates to a device for handling and aligning silicon wafers in readiness for testing and processing. More particularly but not exclusively, it relates to a device for transferring silicon wafers supported on sawframes from storage cassettes to testing and cutting machines.

CLAIM OF PRIORITY

This application claims a priority to application No. GB0112305.8 filed in Great Britian on May 19, 2001, the specification of which is incorporated herein by reference.

BACKGROUND OF THE INVENTION

Electronic devices are conventionally produced on a "wafer" of silicon. Nowadays, such wafers can have diameters up to 300 mm, bearing thousands of individual devices in a rectilinear array. After fabrication of the devices on the wafer, each device requires testing. The wafer must then be accurately cut up into sections bearing individual devices, which can then be processed further to make electronic chips and the like. It is important to align the wafer precisely with respect to the testing apparatus, so that the testing apparatus may conveniently and automatically locate and address each individual device. It is equally important, given how closely devices are packed on to wafers, that the wafer is precisely aligned before being cut up into individual devices.

Wafers are conventionally handled and transported on "sawframes". A sawframe has a generally annular shape, cut from a sheet of stainless steel, aluminium or plastics material. A thin support film of plastics material extends across the circular central aperture of the sawframe, and the wafer itself is mounted to this support film. The outer periphery of the sawframe is not completely circular, but has four straight edges or "flats", usually four, arranged as sections of the sides of a concentric square. These may be referred to as the major flats. The outer periphery of the sawframe is also provided with a plurality of minor flats and other indentations (which may be referred to in general as "notches") the exact form and arrangement of which may vary between manufacturers. These notches or minor flats are each precisely aligned with respect to one of the major flats.

After fabrication, a silicon wafer is mounted to the support film, with the rectilinear array of devices on the wafer being aligned with the major flats of the sawframe with a very high degree of accuracy. The wafer may then be transported safely, with only the sawframe needing to be handled.

The wafers supported on sawframes are generally transported in cassettes, each of which may typically hold up to twenty five sawframes. A cassette comprises an open-ended frame with a plurality of horizontally opposed pairs of horizontal flanges mounted internally to opposing walls of the frame. A single sawframe may be supported between each such pair of flanges, and may be inserted into and removed from the cassette horizontally, through an open end of the frame. The cassettes are generally dimensioned such that two opposite major flats of each sawframe may be approximately aligned with the opposing walls of the frame. However, the sawframes are not a tight fit, in order to facilitate insertion and removal, and so may move around to an extent within the cassette during transport. As a result, the exact alignment of the sawframes relative to the cassette can vary by several degrees on either side of a centre line of the cassette.

Silicon wafers are usually handled in "clean rooms", so robotic devices are preferred for most handling operations. The sawframes are usually removed from cassettes with a robotically-controlled arm ending in a parallel pair of flat prongs. The prongs may be inserted between a pair of flanges of the cassette, then brought up from below the sawframe resting on that pair of flanges, to lift the sawframe from the flanges for removal. A solenoid-operated clamp, is provided adjacent to prongs to bear down on the top of the sawframe, preventing it moving relative to the prongs during handling.

Once transferred to the testing and cutting apparatus, the sawframe and the wafer thereon may be precisely aligned using microscopic imaging and very accurately controllable (x,y) stages. However, such alignment methods are only useful in practice when a sawframe and wafer are presented which are already close to the optimum alignment, It is normal, therefore, to remove a roughly-aligned sawframe from a cassette and to transfer it initially to an intermediate alignment apparatus. This apparatus is provided with two parallel steel jaws, which are closed into contact with opposite major flats of the sawframe. This brings the sawframe and its wafer into sufficiently accurate alignment that, on subsequent transfer to the testing and cutting apparatus, they may be precisely aligned using the (x,y) stages thereof, as described above. The movement of the robotic arm is sufficiently accurate to maintain the alignment of a sawframe once it has picked the sawframe up.

It is inconvenient and expensive to provide such an extra piece of alignment apparatus, and the added alignment steps slow down the processing of the wafers. It would be preferable if the robotic arm could improve the alignment of a sawframe while handling it, eliminating the need for an intermediate alignment apparatus and processing step.

A further problem with the wafer handling system in its current form is the operation of the clamp to hold the sawframe in position on the robotic arm. The solenoid-operated clamps currently employed can be jerky in operation. They also provide no feedback mechanism to indicate whether a sawframe has been securely gripped. When picking up a badly-aligned sawframe, it is possible that the existing clamps will miss the sawframe or only grasp it partially, allowing it to move further out of alignment as it is transferred, or even leaving the sawframe in the cassette as the robotic arm withdraws.

There is hence a need for a more controllable means of holding sawframes in place, as well as a need for a means of indicating whether a sawframe is securely held before it is moved.

It is therefore one object of the present invention to provide a device for handling sawframes which can bring them sufficiently into alignment that they can be transferred from a transport or storage cassette to a testing and cutting apparatus. It is a further object of the present invention to provide an improved means of holding a sawframe in place during handling which obviates the above disadvantages.

SUMMARY OF THE INVENTION

According to a first embodiment of the present invention, there is provided a device to pick up and align a sawframe, comprising means to support the sawframe, alignment means comprising at least one resiliently moveable locating arm, adapted to engage co-operably with a notch on the periphery of the sawframe when the device is moved into contact therewith, thereby urging the sawframe into alignment with the device, and means to maintain the sawframe in position relative to the device, Preferably, the alignment means comprises two resiliently moveable locating arms.

Advantageously, each resiliently moveable locating arm is pivotably mounted to the device.

The resiliently moveable locating arms may be moveable between pre-selected limits, and may be provided with means to select said limits to correspond with any predetermined configuration of notches on the periphery of a sawframe.

The resiliently moveable locating arms may be provided with spring means to govern their motion.

Each locating arm may comprise an arm member and pin means located adjacent an end of the arm member remote from the device and extending substantially orthogonally to the arm member, said pin means being adapted to bear on the periphery of the sawframe and engage with the notches thereon.

The support means preferably comprises support fork means to contact a lower surface of a sawframe.

The support form means may comprise two substantially flat support members, disposed parallel and coplanarly one with the other.

The means to maintain position may comprise clamp means, adapted to be brought into contact with an upper in use surface of a sawframe, thereby gripping the sawframe between the clamp means and the support means.

Said clamp means may be activated pneumatically, advantageously by applying vacuum to a clamp member thereof to urge it to bear on the sawframe.

The clamp means may be provided with vent means to release the vacuum if the sawframe is not correctly disposed for the clamp member to bear thereon.

The vent means may be adapted to release the vacuum when the clamp member is moved beyond a position where it would normally contact an upper surface of the sawframe.

The vent means may comprise plunger means, biased to seal a vent aperture, configured so that the clamp member bears thereon when moved beyond a normal clamping position, whereby the plunger means is urged out of its sealing disposition to allow air to enter through the vent aperture.

The device may be provided with means to detect operation of the vent means, such as pressure sensing means, and means to signal to a control means for the robotic handling device and/or a human operator that a sawframe has not been grasped successfully.

The device may be further provided with secondary means to handle sawframes, comprising support means and holding means as described above, but without alignment means.

According to a second embodiment of the present invention, there is provided a method for picking up, aligning and transferring sawframes, comprising the steps of providing a device as described above in the first embodiment of the present invention, moving the device into contact with a sawframe held substantially horizontally in a cassette such that the support means is disposed below the sawframe and the at least one locating arm contacts a periphery of the sawframe, moving the device further towards the sawframe so that the at least one locating arm engages with one or more corresponding notches on the periphery of the sawframe and urges the sawframe into alignment with the device, causing the holding means to grasp the sawframe once aligned, removing the sawframe from the cassette and presenting it to further processing apparatus while maintaining its alignment.

BRIEF DESCRIPTION OF THE DRAWINGS

The present invention will now be more particularly described, by way of example and with reference to the accompanying drawings, in which:

FIG. 3 is a cross-sectional view of the device of FIG. 1, taken along the line 111-111;

FIG. 4 shows a part of FIG. 3 in greater detail; and

DETAILED DESCRIPTION OF THE ONE EXAMPLE OF A PREFERRED EMBODIMENT

Figure 1:
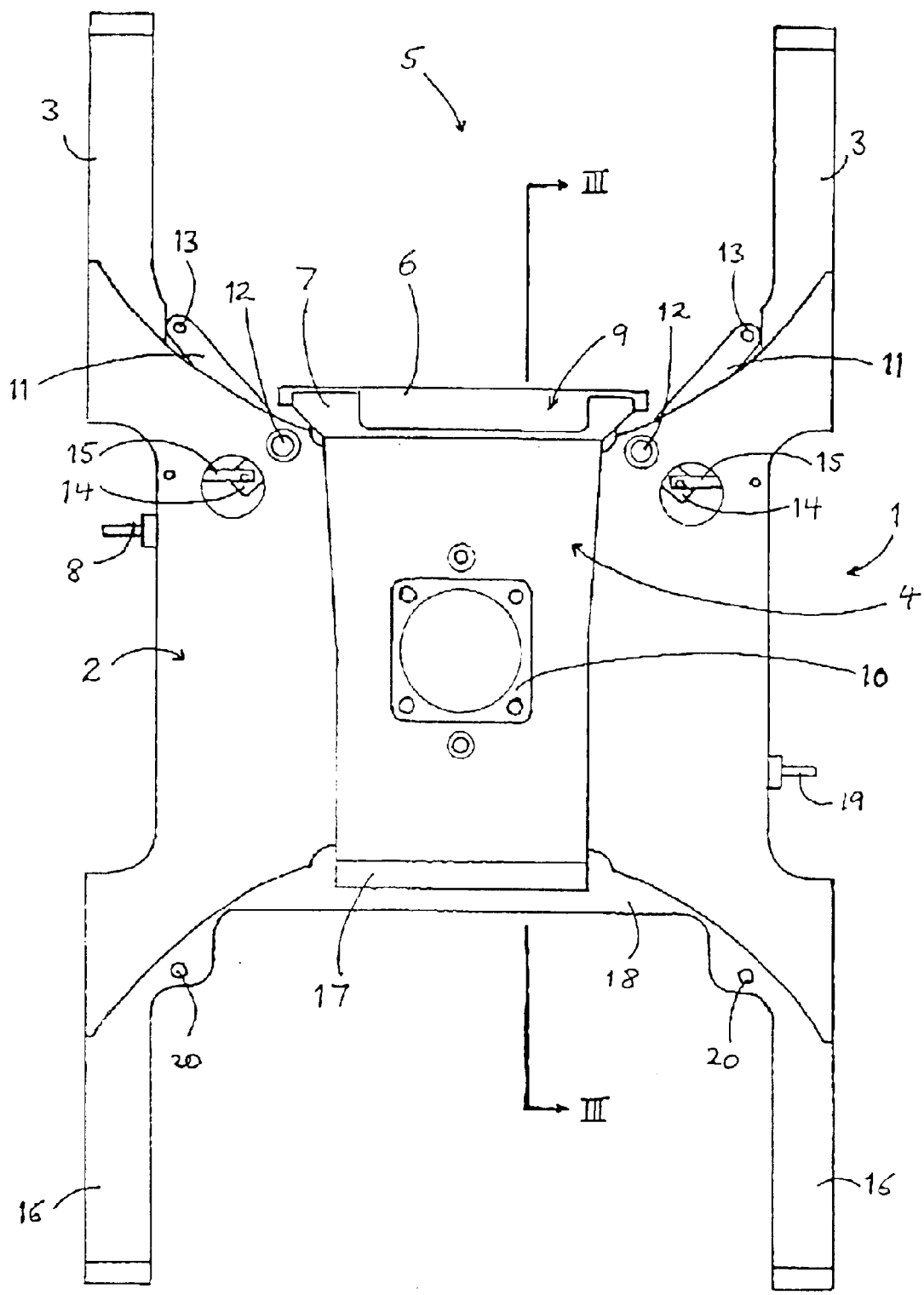
FIG. 1 is a plan view of a device embodying the invention.
Figure 5:
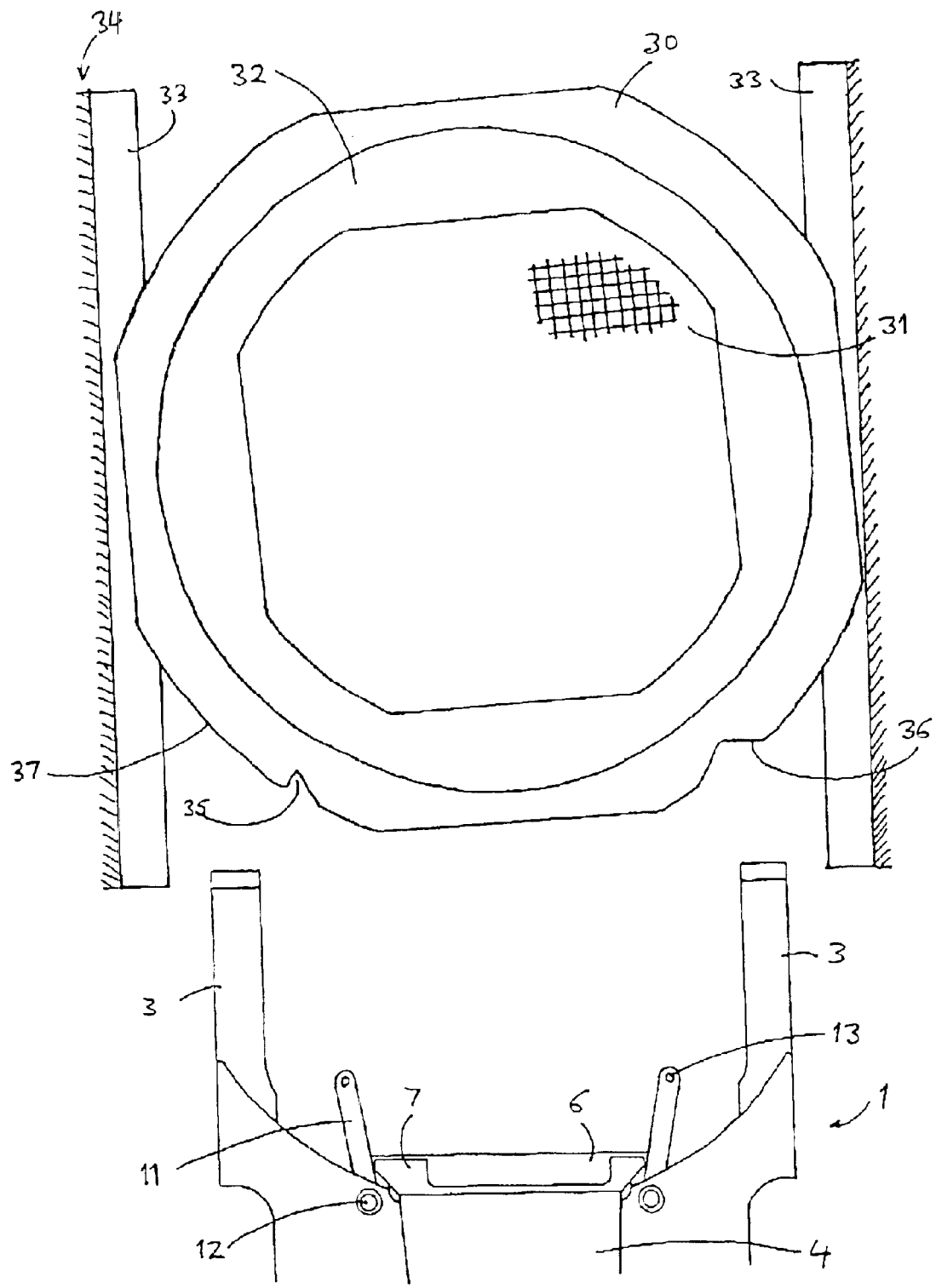
FIG. 5 shows the device in use.

Referring now to the drawings and to FIG. 1 in particular, a sawframe handling device 1 will be described in terms of its conventional orientation in use. In this orientation, the plane of FIGS. 1 and 5 is a substantially horizontal plane, "up" denotes a direction towards the viewer and "down" denotes a direction away therefrom. The terms "upper" and "lower" may be similarly construed. FIGS. 3 and 4 are thus sections taken in a substantially vertical plane. It should be noted for the sake of clarity that a device embodying the present invention may, if circumstances so dictate, be usable in a non-horizontal plane, or even disposed horizontally but inverted. The terminology above is not limiting and is used solely for conciseness.

The sawframe handling device 1 comprises a main body 2 provided with two outwardly extending main support members 3. A clamp unit 4 is mounted to the main body 2 and extends into a gap 5 between the main support members 3. A lower jaw 6 of the clamp unit 4 comprises a fixed extension of the main body 2, and an upper jaw 7 of the clamp unit 4 is urgeable in the direction of the lower jaw 6 by a suction mechanism (described in more detail below). The suction mechanism is connected to a suitable vacuum supply via a vacuum coupling 8. In the embodiment shown, the upper jaw 7 is provided with a recess 9, to permit reading of identifying data which are frequently imprinted on a corresponding portion of a sawframe.

The handling device 1 is mountable to a robotic arm by means of a mounting 10.

The handling device 1 has two locating arms 11, each mounted to the main body 2 by a pivot mounting 12. A locating pin 13 extends upwardly from a point adjacent an end of each locating arm 11 remote from the respective pivot mounting 12. Each locating arm 11 is generally L-shaped with a leg 14, extending from the pivot mounting 12, which engages with a tension spring 15 mounted to the main body 2. A coil spring is also provided within each pivot mounting 12. The locating arms 11 may thus move within the gap 5, their pivoting motion being regulated by said springs. The springs are normally so balanced that the locating arms 11 are disposed, in the absence of any body, particularly a sawframe, bearing thereon, almost parallel but at an angle one to the other, as shown in FIG. 5. The locating arms 11 are shown in FIG. 1 in a limiting disposition, in contact with each main support member 3.

The handling device 1 shown is also provided with means for handling sawframes when the alignment thereof is not critical, for example, when removing "used" sawframes from a cutting apparatus. This secondary handling means comprises two secondary support members 16 mounted to an end of the handling device 1 remote from the main support members 3. The clamp unit 4 has a secondary upper jaw 17 at an end thereof remote from the upper jaw 7, and a secondary lower jaw 18 which comprises a fixed extension of the main body 2. The secondary upper jaw 17 is urgeable towards the secondary lower jaw 18 by a suction mechanism, corresponding to that provided for the upper jaw 7, and connected to a suitable vacuum supply via a secondary vacuum coupling 19. Two fixed locating pins 20 extend upwardly from the secondary lower jaw 18.

Figure 2:
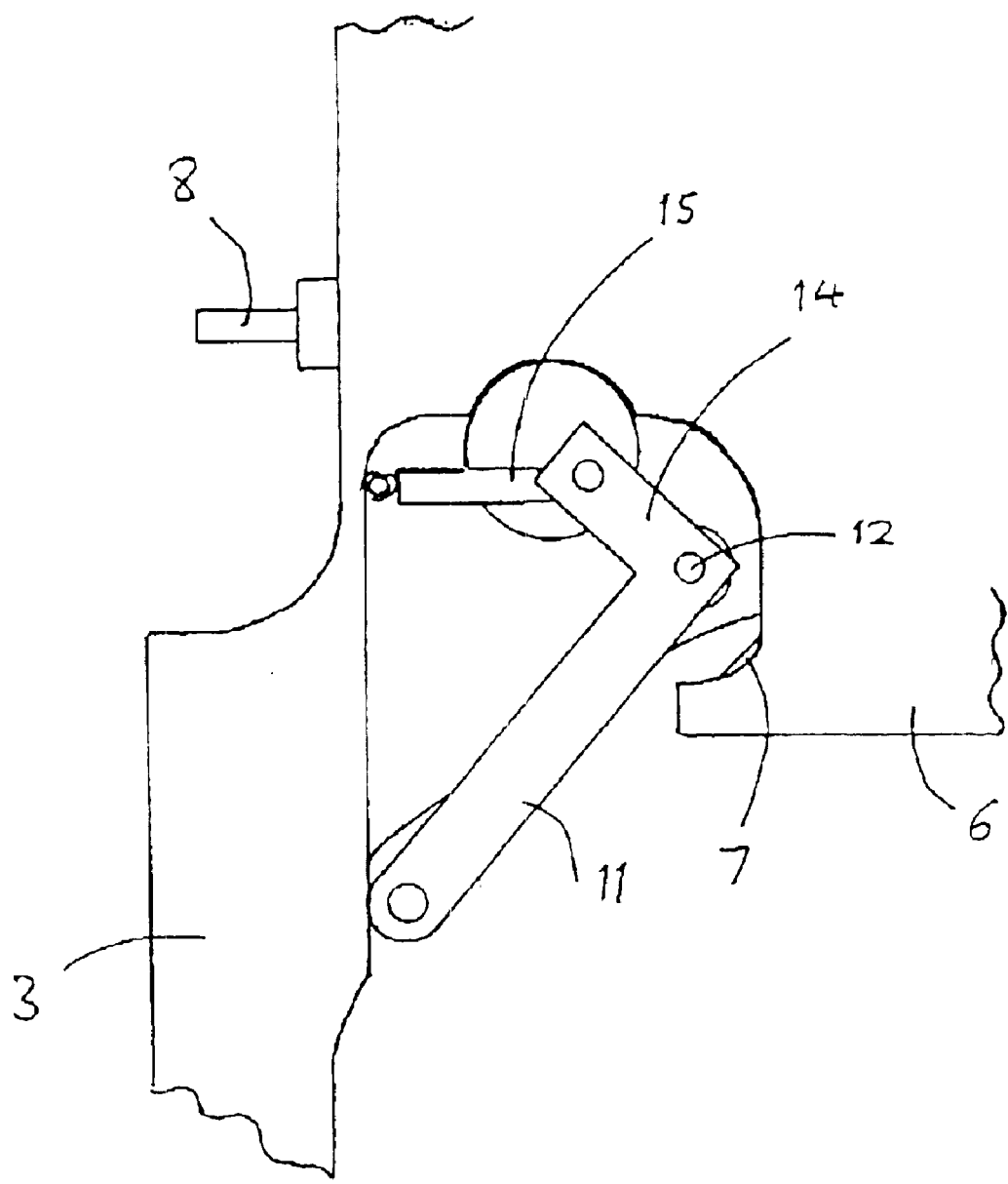
FIG. 2 is a partial view of the device of FIG. 1, viewed from an opposite face.

FIG. 2 shows one locating arm 11 in more detail, viewed from below the handling device 1, to clarify the form and relationship of the locating arm 11, the pivot mounting 12, the projection 14 of the locating arm and the tension spring 15.

FIGS. 3 and 4 show in cross section the clamp unit 4 (FIG. 4 shows only the clamping mechanism associated with the secondary upper jaw 17). A cylindrically symmetrical resilient sealing ring 21 with a frustoconical upper portion 22 is mounted to the main body 2 of the handling device 1. The upper portion 22 extends close to or in contact with the secondary upper jaw 17. The clamping mechanism is operated by connection to the vacuum line 23, which is connected to the secondary vacuum coupling 19. The secondary upper jaw 17 is drawn downwardly to contact and/or compress the upper portion 22 of the sealing ring 21. The upper portion of the clamp unit 4, comprising the upper jaw 7 and the secondary upper jaw 17, tilts about a pivot bar 24, in this case moving the secondary upper jaw 17 in the direction of the secondary lower jaw 18, and thereby grasping a sawframe present therebetween.

A similar clamping mechanism with a sealing ring 21 is provided to operate the main jaw mechanism, with a vacuum line 23 connected to the vacuum coupling 8 via a manifold, and operated as described above for the secondary jaw mechanism.

The resilience of the sealing rings 21 should urge the upper jaws 7, 17 out of contact with a sawframe held by the respective jaw mechanism, when vacuum is released. Alternatively or additionally, operation of the opposing jaw mechanism will tilt a respective upper jaw 7, 17 upwardly, positively moving it out of contact with the sawframe.

A relief valve 25 is provided in case a sawframe is not present between the jaws when vacuum is applied. The relief valve 25 comprises a relief plunger 26, biased by a spring (not shown) to sit sealingly in a vent aperture 27. An upper tip 28 of the relief plunger 26 contacts a lower surface of the upper jaw, in the case of FIG. 4 the secondary upper jaw 17, when the clearance between the secondary upper jaw 17 and the secondary lower jaw 18, shown by arrows 29, is equal to the thickness of a sawframe. If the secondary upper jaw 17 is drawn downwardly in the absence of a sawframe, it will bear on the upper tip 28 and force the relief plunger 26 out of its sealing disposition within the vent aperture 27. The vacuum will thus be released, and the secondary upper jaw 17 will return to an open disposition. A similar relief valve is provided to allow the main upper jaw 7 to be released.

A detector is provided, coupled to the vacuum supply, which registers the loss of vacuum, automatically cuts off application of vacuum to the mechanism, and notifies a control mechanism and/or an operator that the handling device 1 has failed to pick up a sawframe as intended.

Turning now to FIG. 5, a sawframe 30 is shown, mounted to which is a silicon wafer 31, resting on a polymer film 32. The sawframe 30 is resting on two corresponding flanges 33 of a transport cassette 34. It will be noted that the sawframe 30 does not fit exactly between opposing walls of the cassette 34, and is not accurately aligned therewith. The sawframe 30 shown is provided with an indentation 35 and a minor flat 36 in the outer rim 37 thereof. Other forms of sawframe may be provided with different configurations of notches, but all have at least two notches which may be oriented generally in the direction from which a handling device 1 may be introduced.

The handling device 1 may easily be accurately aligned with the cassette 34. As the handling device 1 approaches the sawframe 30, its main support members 3 move beneath the sawframe 30. The locating pins 13 of the locating arms 111 then bear on the rim 37 of the sawframe 30, either simultaneously or sequentially, depending on the exact alignment of the sawframe 30. Further movement of handling device 1 towards the sawframe 30 urges the locating pins 13 to travel along the rim 37, causing each locating arm 11 to pivot outwardly, about its respective pivot mounting 12, in the direction of a respective main support member 3. For the sawframe alignment shown, one locating pin 13 first enters and engages with the indentation 35, and the other locating pin then enters and engages with the minor flat 36.

Since the locating arms 11 are spring-loaded, the locating pins 13 bear on the rim 37 so as to urge the sawframe 30 into a desired alignment. The locating arms 11 may be adjusted so that for any given configuration of notches on the rim 37, when each locating pin 13 is engaged with a notch, the sawframe 30 is accurately aligned with the handling device 1.

A portion of the rim 37 of the sawframe 30 is then disposed between the upper jaw 7 and the lower jaw 6 of the clamp unit 4, and the upper jaw 7 may be brought down on to the upper surface of the sawframe 30, as described above, to hold the sawframe 30 firmly against the lower jaw 6 and the main support members 3.

The sawframe 30 may then be removed from the cassette 34 and offered up to a testing and/or cutting apparatus, sufficiently accurately aligned therewith that only minor alignment adjustments are required.

The spring-loaded locating arms may easily be adjusted to operate with a given configuration of sawframe, and there are only a small number of standard configurations for which adjustments need to be devised. In certain cases, one of the locating arms may even be fixed in position, the device being able to align such a sawframe with only one moveable locating arm.

The device of the present invention thus provides a quick and accurate means of picking up and aligning sawframes stored in a cassette, without the need for an intermediate alignment apparatus. It may easily be fitted to existing robotic handling equipment. The pneumatically operated clamping mechanism is effective, easily controllable and allows for automatic shut off of the clamping mechanism if a sawframe is not correctly held in its jaws.

What is claimed is:

1. A device to pick up and align a sawframe for supporting a wafer, the device comprising:
   a body;
   means to support the sawframe extending from the body;
   alignment means, attached to the body, comprising at least one resiliently moveable locating arm adapted to engage co-operably with a notch on the periphery of the sawframe so as to urge the sawframe into alignment with the device; and clamping means comprising a movable member, attached to the body, contactable with an upper planar surface of the sawframe, the clamping means being operable to grip the sawframe between the movable member and the support means to maintain the sawframe in position relative to the device.

2. A device as claimed in claim 1, wherein the alignment means comprises two resiliently moveable locating arms mounted pivotably to the body.

3. A device as claimed in claim 2, wherein the resiliently moveable locating arms are moveable between pre-selected limits, and are provided with means to select said limits to correspond with any predetermined configuration of notches on the periphery of a sawframe.

4. A device as claimed in claim 1, wherein said at least one locating arm comprises an arm member and pin means located adjacent an end of the arm member remote from the body and extending substantially orthogonally to the arm member, said pin means being adapted to bear on the periphery of the sawframe and engage with said notch thereon.

5. A device as claimed in claim 1, wherein the support means comprises two substantially flat support members, disposed parallel and coplanarly one with the other.

6. A device as claimed in claim 1, further comprising means to activate pneumatically the clamp means.

7. A device as claimed in claim 6, wherein the means to activate the clamp means comprises applying vacuum to a clamp member thereof to urge it to bear on the sawframe.

8. A device as claimed in claim 7, wherein the clamp means is provided with vent means to release the vacuum if the sawframe is not correctly disposed for the clamp member to bear thereon.

9. A device as claimed in claim 8, wherein the vent means comprises plunger means biased to seal a vent aperture configured so that the clamp member bears thereon when moved beyond a normal clamping position, whereby the plunger means is urged out of its sealing disposition to allow air to enter through the vent aperture.

10. A device as claimed in claim 8, further comprising means to detect operation of the vent means and means to signal to a control means for the robotic handling device and/or a human operator that a sawframe has not been grasped successfully.

11. A device as claimed in claim 10, wherein the detection means comprises pressure sensing means.

12. A method for picking up, aligning and transferring sawframes for supporting a wafer, the method comprising:

providing a device as claimed in claim 1, moving the device into contact with, a sawframe held substantially horizontally in a cassette such that the support means is disposed below the sawframe and the at least one locating arm contacts a periphery or the sawframe, moving the device further towards the sawframe so that the at least one locating arm engages with one or more corresponding notches on the periphery of the sawframe and urges the sawframe into alignment with the device, causing a holding means to grasp the sawframe once aligned, and removing the sawframe from the cassette and presenting it to further processing apparatus while maintaining its alignment.

\* \* \* \* \*